(12) United States Patent
Tsai et al.

(10) Patent No.: US 6,706,640 B1
(45) Date of Patent: Mar. 16, 2004

(54) METAL SILICIDE ETCH RESISTANT PLASMA ETCH METHOD

(75) Inventors: Ming-Huan Tsai, Hsinchu (TW); Ju-Wang Hsu, Taipei (TW); Peng-Fu Hsu, Hsinchu (TW); Hun-Jan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/292,355

(22) Filed: Nov. 12, 2002

(51) Int. Cl.[7] .................. H01L 21/302; H01L 21/461
(52) U.S. Cl. ................................................ 438/740
(58) Field of Search ..................... 438/710, 715, 438/735, 736, 738, 740

(56) References Cited

U.S. PATENT DOCUMENTS 5,269,879 A * 12/1993 Rhoades et al. ............ 438/694
5,935,877 A     8/1999  Autryve
6,117,786 A *  9/2000  Khajehnouri et al. ....... 438/700
6,265,271 B1   7/2001  Thei et al.

* cited by examiner

Primary Examiner—Craig Thompson
(74) Attorney, Agent, or Firm—Tung & Associates

(57) ABSTRACT

A plasma etch method for etching a dielectric layer and an etch stop layer to reach a metal silicide layer formed thereunder employs for etching the etch stop layer an etchant gas composition comprising a fluorine containing gas and a nitrogen containing gas, preferably with a carrier gas such as argon or helium, but without an oxygen containing gas or a carbon and oxygen containing gas. The plasma etch method is selective for the etch stop layer with respect to the metal silicide layer, thus maintaining the physical and electrical integrity of the metal silicide layer.

20 Claims, 3 Drawing Sheets

METAL SILICIDE ETCH RESISTANT PLASMA ETCH METHOD

BACKGROUND OF THE INVENTION

1. Field of the Invention

The present invention relates generally to plasma etch methods for forming patterned layers within microelectronic products. More particularly, the present invention relates to metal silicide etch resistant plasma etch methods for forming patterned layers within microelectronic products.

2. Description of the Related Art

As microelectronic fabrication integration levels have increased and patterned microelectronic conductor layer dimensions have decreased, it has become increasingly common within the microelectronic product fabrication art to employ metal silicide layers as contact layers for microelectronic conductor layers and microelectronic conductor structures. Metal silicide layers are desirable as contact layers insofar as metal silicide layers generally provide low contact resistance contact layers.

While metal silicide layers are thus desirable in the microelectronic product fabrication art and often essential in the microelectronic product fabrication art, metal silicide layers are nonetheless not entirely without problems. In that regard, it is often difficult to maintain the physical and electrical integrity of metal silicide layers when fabricating microelectronic products.

It is thus desirable to provide methods for maintaining the integrity of metal silicide layers formed therein when fabricating microelectronic products.

It is towards the foregoing object that the present invention is directed.

Various methods for fabricating microelectronic products having formed therein metal silicide layers have been disclosed within the microelectronic product fabrication art.

Included but not limiting among the methods are methods disclosed within: (1) Autryve, in U.S. Pat. No. 5,935,877 (a plasma etch method for forming a via reaching a titanium silicide layer absent etching the titanium silicide layer); and (2) Thei et al., in U.S. Pat. No. 6,265,271 (a method which integrates a salicide metal silicide layer within the context of a borderless contact structure). The teachings of each of the foregoing references are incorporated herein fully by reference.

Desirable are additional methods for fabricating microelectronic products having formed therein metal silicide layers while maintaining the integrity of the metal silicide layers.

It is towards the foregoing object that the present invention is directed.

SUMMARY OF THE INVENTION

A first object of the invention is to provide a method for fabricating a microelectronic product having formed therein a metal silicide layer.

A second object of the invention is to provide a method in accord with the first object of the invention, wherein the integrity of the metal silicide layer is maintained.

In accord with the objects of the invention, the present invention provides a method for fabricating a microelectronic product.

To practice the method of the invention, there is first provided a substrate having formed thereover a metal silicide layer. There is then formed upon the metal silicide layer an etch stop layer. There is then formed upon the etch stop layer a dielectric layer. There is then etched, while employing a first etch method, the dielectric layer to form a patterned dielectric layer which exposes the etch stop layer. Finally, there is then etched, while employing a second plasma etch method, the etch stop layer to form a patterned etch stop layer which exposes the metal silicide layer. Within the invention, the second plasma etch method employs an etchant gas composition comprising a fluorine containing gas and a nitrogen containing gas, without an oxygen containing gas or a carbon and oxygen containing gas.

Within the invention, the etchant gas composition employed within the second plasma etch method preferably may also comprise a carrier gas, such as helium or argon.

Within the invention, a patterned photoresist layer employed within the first etch method as an etch mask layer is stripped prior to etching the etch stop layer to form the patterned etch stop layer while employing the second plasma etch method.

The invention provides a method for fabricating a microelectronic product having formed therein a metal silicide layer, wherein the integrity of the metal silicide layer is maintained.

The invention realizes the foregoing object within the context of etching an etch stop layer to reach a metal silicide layer formed thereunder by employing a plasma etch method employing an etchant gas composition comprising a fluorine containing gas and a nitrogen containing gas without an oxygen containing gas or a carbon and oxygen containing gas. In particular, the absence of a carbon and oxygen containing gas provides for enhanced selectivity for etching the etch stop layer with respect to the metal silicide layer, since carbon and oxygen containing gases (such as carbon monoxide) readily form volatile compounds (such as volatile metal carbonyl compounds) with metals from which are formed metal silicide layers.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a microelectronic product having formed therein a metal silicide layer, wherein the integrity of the metal silicide layer is maintained.

The invention realizes the foregoing object within the context of etching an etch stop layer to reach a metal silicide layer formed thereunder by employing a plasma etch method employing an etchant gas composition comprising a fluorine containing gas and a nitrogen containing gas without an oxygen containing gas or a carbon and oxygen containing gas. In particular, the absence of a carbon and oxygen containing gas provides for enhanced selectivity for etching the etch stop layer with respect to the metal silicide layer, since carbon and oxygen containing gases (such as carbon monoxide) readily form volatile compounds (such as volatile metal carbonyl compounds) with metals from which are formed metal silicide layers.

FIG. 1 to FIG. 4 show a series of schematic cross-sectional diagrams illustrating the results of progressive stages of fabricating a microelectronic product in accord with a general embodiment of the invention which comprises a first preferred embodiment of the invention.

Figure 1:
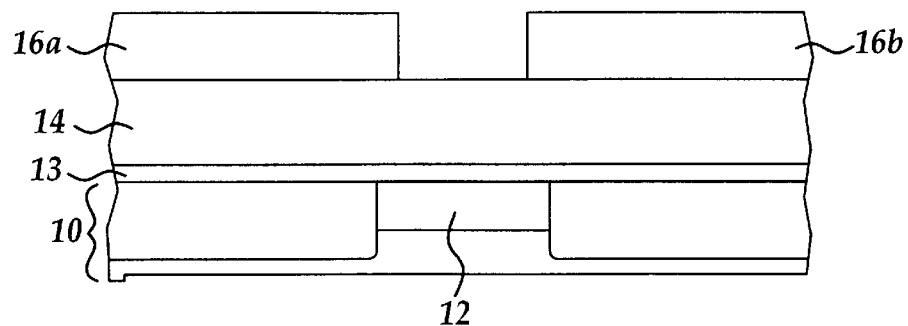
FIG. 1, FIG. 2, FIG. 3 and FIG. 4 show a series of schematic cross-sectional diagrams illustrating the results of progressive stages of fabricating a microelectronic product in accord with a general embodiment of the invention which comprises a first preferred embodiment of the invention.

FIG. 1 shows a schematic cross-sectional diagram of the microelectronic product at an early stage in its fabrication in accord with the first preferred embodiment of the invention.

FIG. 1 shows a substrate 10 having formed therein and thereupon (which is intended within the context of the invention as claimed to include thereover) a metal silicide layer 12. FIG. 1 also shows an etch stop layer 13 formed upon exposed portions of the substrate 10 and the metal silicide layer 12. FIG. 1 also shows a dielectric layer 14 formed upon the etch stop layer 13. FIG. 1 finally shows a pair of patterned photoresist layers 16a and 16b formed upon the dielectric layer 14 and defining an aperture over the metal silicide layer 12.

Within the invention, the substrate 10 may be employed within a microelectronic product selected from the group including but not limited to integrated circuit products (including semiconductor products), ceramic substrate products and optoelectronic products.

Although not illustrated within the schematic cross-sectional diagram of FIG. 1, the substrate 10 may consist of a substrate alone as employed within the microelectronic product. In an alternative, the substrate 10 may comprise a substrate as employed within the microelectronic product, where the substrate has formed thereupon and/or thereover any of several additional microelectronic layers as are conventional within the microelectronic product within which is employed the substrate 10. Such additional microelectronic layers may be formed from microelectronic materials selected from the group including but not limited to conductor materials, semiconductor materials and dielectric materials.

Although also not specifically illustrated within the schematic cross-sectional diagram of FIG. 1, the substrate 10, typically and preferably (but not exclusively) when the substrate 10 consists of or comprises a semiconductor substrate employed within a semiconductor integrated circuit product, has formed therein and/or thereupon microelectronic devices as are conventional within the microelectronic product within which is employed the substrate 10. Such microelectronic devices may be selected from the group including but not limited to resistors, transistors, diodes and capacitors.

Within the invention, the metal silicide layer 12 may be formed from any of several metals, including but not limited to nickel, cobalt, titanium, tantalum, tungsten, vanadium, molybdenum and niobium. The metal silicide layer 12 may also be formed employing any of several methods, including but not limited to chemical vapor deposition (CVD) methods and salicide thermal annealing methods. Typically, the metal silicide layer 12 is formed to a thickness of from about 30 to about 600 angstroms.

Within the invention, the etch stop layer 13 will typically be formed of a silicon containing etch stop material such as a silicon nitride material, a silicon oxynitride material, a laminate thereof or a silicon oxide material or silsesquioxane material laminate thereof. Typically, the etch stop layer 13 is formed to a thickness of from about 50 to about 600 angstroms.

Within the invention, the blanket dielectric layer 14 may be formed from any of several dielectric materials as are conventional or unconventional in the microelectronic fabrication art. Such dielectric materials may include, but are not limited to, silicon containing dielectric materials such as silicon oxide dielectric materials and silsesquioxane dielectric materials (such as but not limited to hydrogen silsesquioxane dielectric materials and methyl silsesquioxane dielectric materials). Typically, the blanket dielectric layer 14 is formed to a thickness of from about 2000 to about 10000 angstroms.

Within the invention, the pair of patterned photoresist layers 16a and 16b may be formed of photoresist materials as are conventional or unconventional in the microelectronic product fabrication art. Typically, the pair of patterned photoresist layers 16a and 16b is formed to a thickness of from about 2000 to about 8000 angstroms.

Figure 2:
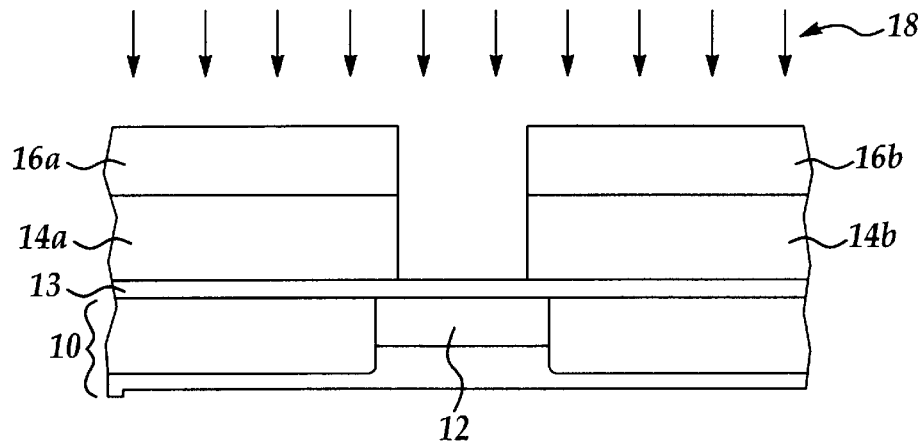

FIG. 2 shows the results of further processing of the microelectronic product of FIG. 1.

FIG. 2 shows the results of etching the dielectric layer 14 to form a pair of patterned dielectric layers 14a and 14b which defines an aperture which reaches and exposes the etch stop layer 13, while employing a first etching plasma 18.

Within the invention, the first etching plasma 18 will typically employ an etchant gas composition as is appropriate to the dielectric material from which is formed the dielectric layer 14.

Figure 3:
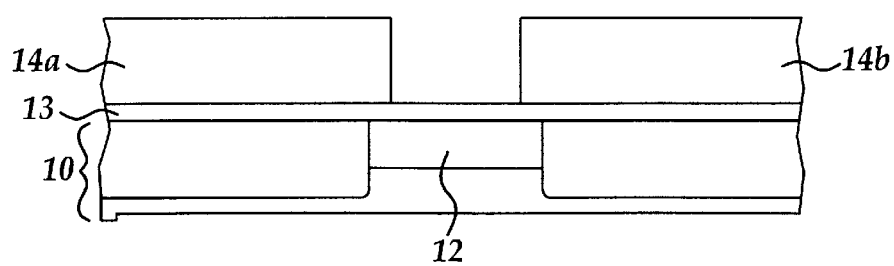

FIG. 3 shows the results of further processing of the microelectronic product of FIG. 2.

FIG. 3 shows the results of stripping the pair of patterned photoresist layers 16a and 16b from the pair of patterned dielectric layers 14a and 14b.

The pair of patterned photoresist layers 16a and 16b may be stripped employing methods and materials as are conventional in the microelectronic product fabrication art, including but not limited to wet chemical stripping methods, dry plasma stripping methods and aggregate wet chemical stripping methods and dry plasma stripping methods.

Figure 4:
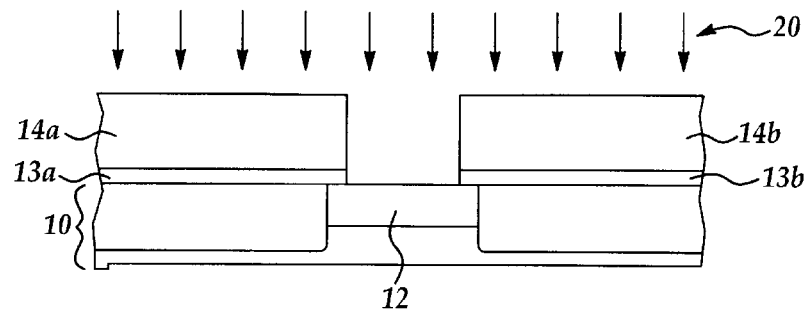

FIG. 4 shows the results of further processing of the microelectronic product of FIG. 3.

FIG. 4 shows the results of etching the blanket etch stop layer 13 to form a pair of patterned etch stop layers 13a and 13b such as to expose the metal silicide layer 12, while employing the pair of patterned dielectric layers 14a and 14b as a pair of etch mask layers, in conjunction with a second etching plasma 20.

Within the invention, the second etching plasma 20 employs an etchant gas composition comprising a fluorine containing gas and a nitrogen containing gas, without an oxygen containing gas or a carbon and oxygen containing gas.

Typically, the fluorine containing gas may be selected from the group including but not limited to, C1–C6 linear, branched and cyclic perfluorocarbons and hydrofluorocarbons, as well as sulfur hexafluoride and nitrogen trifluoride. More typically, the present invention employs at least one C1–C2 perfluorocarbon gas or hydrofluorocarbon gas as the fluorine containing gas. Typically, the nitrogen containing gas is selected from the group including but not limited to nitrogen, ammonia and hydrazine. Typically, the excluded carbon and oxygen containing gases are intended to include, but are not limited to, carbon monoxide and carbon dioxide. Typically, the excluded oxygen containing gases are intended to include, but are not limited to, oxygen and ozone. Within the invention additional unreactive carrier, diluent and sputtering gas components (such as argon and helium) typically may also be employed within the second etching plasma 20.

Within the invention, the second etching plasma 20 typically also employs: (1) a reactor chamber pressure of from about 0.001 to about 1 torr; (2) a radio frequency source power of from about 50 to about 5000 watts and a bias power of from about 50 to about 500 watts; (3) a substrate 10 (and overlying layers) temperature of from about −30 to about 80 degrees centigrade; (4) a fluorine containing gas flow rate of from about 5 to about 100 standard cubic centimeters per minute (sccm); (5) a nitrogen containing gas flow rate of from about 10 to about 1000 standard cubic centimeters per minute; and (6) an optional argon sputtering gas component at a flow rate of from about 50 to about 1000 standard cubic centimeters per minute.

FIG. 4 illustrates a microelectronic product formed in accord with a first preferred embodiment of the invention. The microelectronic product has formed therein an etch stop layer which is etched within a fluorine containing etching plasma to reach a metal silicide layer without etching the metal silicide layer. The invention realizes the foregoing object by employing within the fluorine containing etching plasma an etchant gas composition comprising a fluorine containing gas and a nitrogen containing gas, without an oxygen containing gas or a carbon and oxygen containing gas.

FIG. 5 to FIG. 9 show a series of schematic cross-sectional diagrams illustrating the results of progressive stages of fabricating a semiconductor product in accord with a more specific embodiment of the invention which comprises a second preferred embodiment of the invention.

Figure 5:
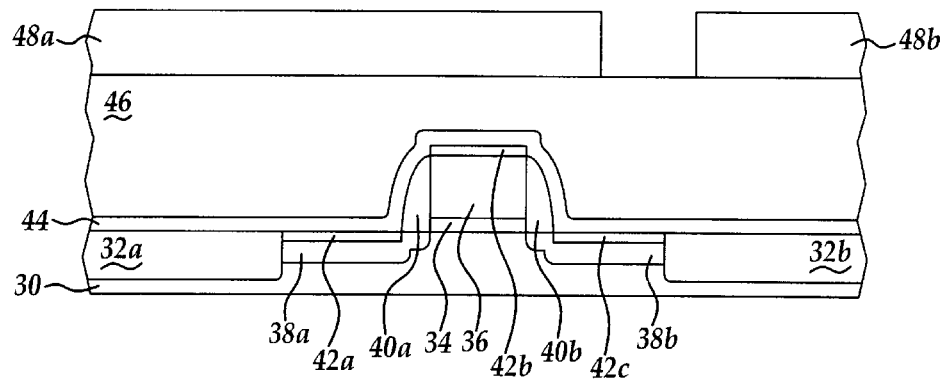
FIG. 5, FIG. 6, FIG. 7, FIG. 8 and FIG. 9 show a series of schematic cross-sectional diagrams illustrating the results of progressive stages of fabricating a semiconductor product in accord with a more specific embodiment of the invention which comprises a second preferred embodiment of the invention.

FIG. 5 shows a schematic cross-sectional diagram of the semiconductor product at an early stage in its fabrication in accord with the second preferred embodiment of the invention.

FIG. 5 shows a semiconductor substrate 30 having formed therein a pair of isolation regions 32a and 32b which define an active region of the semiconductor substrate 30.

Although semiconductor substrates are known with either dopant polarity, several dopant concentrations and various crystallographic orientations, for the second preferred embodiment of the invention the semiconductor substrate 30 is typically a (100) silicon semiconductor substrate having a comparatively light N or P doping. In addition, although isolation regions are known to be formed employing various methods, such as local oxidation of silicon (LOCOS) methods and shallow trench isolation (STI) methods, for the second preferred embodiment of the invention, the pair of isolation regions 32a and 32b is typically formed as a pair of shallow trench isolation regions.

FIG. 5 also shows a field effect transistor (FET) device formed within and upon the active region of the semiconductor substrate 30. The field effect transistor device comprises: (1) a gate dielectric layer 34 formed upon the active region of the semiconductor substrate 30; (2) a gate electrode 36 formed aligned upon the gate dielectric layer 34; (3) a pair of spacer layers 40a and 40b formed adjoining a pair of opposite sidewalls of the gate dielectric layer 34 and the gate electrode 36; and (4) a pair of source/drain regions 38a and 38b formed into the active region of the semiconductor substrate 30 at areas not covered by the gate electrode 36 and the gate dielectric layer 34.

Within the invention: (1) the gate dielectric layer 34 is typically formed at least in part of a silicon oxide material formed to a thickness of from about 10 to about 100 angstroms; (2) the gate electrode 36 is typically formed of a doped polysilicon (having a dopant concentration of about 1E20 dopant atoms per cubic centimeter) or polycide (doped polysilicon/metal silicide stack) material; (3) the pair of spacer layers 40a and 40b is typically formed of a silicon oxide material or a silicon nitride material; and (4) the pair of source/drain regions 38a and 38b is typically formed employing a two-step ion implant method employing a lower dose ion implant prior to forming the pair of spacer layers 40a and 40b and a higher dose ion implant after forming the pair of spacer layers 40a and 40b.

FIG. 5 also shows a series of metal silicide layers 42a, 42b and 42c formed upon the pair of source/drain regions 38a and 38b, as well as the gate electrode 36. Within the invention, the series of metal silicide layers 42a, 42b and 42c may be formed of metal silicide materials as enumerated for the metal silicide layer 12 in accord with the first preferred embodiment of the invention.

FIG. 5 also shows a blanket conformal etch stop layer 44 formed upon exposed portions of the pair of isolation regions 32a and 32b, the series of metal silicide layers 42a, 42b and 42c and the pair of spacer layers 40a and 40b. FIG. 5 similarly also shows a blanket planarized pre-metal dielectric layer 46 formed upon the blanket conformal etch stop layer 44. Finally, FIG. 5 also shows a pair of patterned photoresist layers 48a and 48b formed upon the blanket planarized pre-metal dielectric layer 46 and defining an aperture above the metal silicide layer 42c and the isolation region 32b.

Within the invention, the blanket conformal etch stop layer 44 is formed of a silicon containing dielectric material selected from the group including but not limited to silicon nitride dielectric materials, silicon oxynitride dielectric materials, laminates thereof and silicon oxide dielectric material laminates thereof. Typically, the blanket conformal etch stop layer 44 is formed to a thickness of from about 50 to about 600 angstroms. Within the invention, the blanket planarized pre-metal dielectric layer 46 is formed of a silicon oxide dielectric material formed to a thickness of from about 2000 to about 10000 angstroms. Within the second preferred embodiment of the invention the pair of patterned photoresist layers 48a and 48b are otherwise analogous, equivalent or identical in dimensions and materials compositions to the pair of patterned photoresist layers 16a and 16b as disclosed within the context of the first preferred embodiment of the invention.

Figure 6:
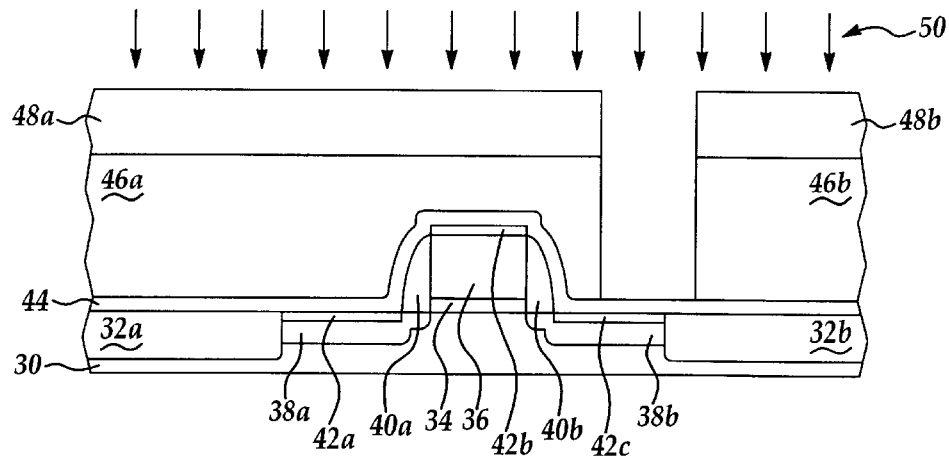

FIG. 6 illustrates the results of further processing of the semiconductor product of FIG. 5.

FIG. 6 illustrates the results of etching the blanket planarized pre-metal dielectric layer 46 to form a pair of patterned planarized pre-metal dielectric layers 46a and 46b which define an aperture which reaches the blanket conformal etch stop layer 44. The aperture is formed while employing the pair of patterned photoresist layers 48a and 48b as a pair of etch mask layers, in conjunction with a first etching plasma 50.

Within the invention, the first etching plasma 50 is selected such as to exhibit enhanced etch selectivity properties for the blanket planarized pre-metal dielectric layer 46 with respect to the blanket conformal etch stop layer 44. Typically, the first etching plasma 50 will employ an etchant gas composition comprising a fluorine containing gas, but not necessarily of composition in accord with the present invention.

Figure 7:
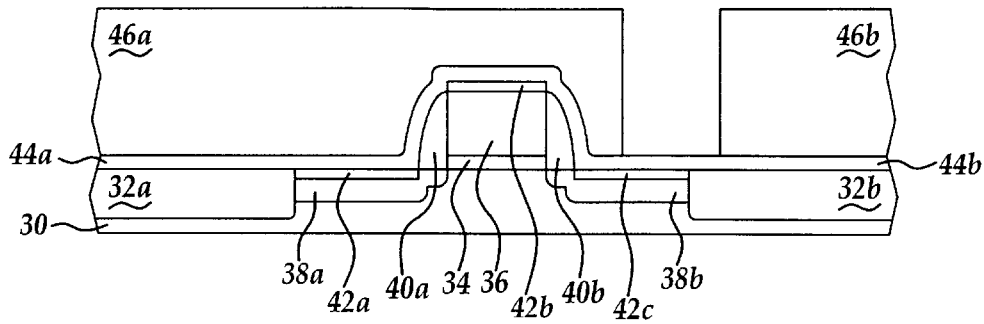

FIG. 7 illustrates the results of further processing of the semiconductor product of FIG. 6.

FIG. 7 illustrates the results of stripping the pair of patterned photoresist layers 48a and 48b from the pair of patterned pre-metal dielectric (PMD) layers 46a and 46b.

The pair of patterned photoresist layers 48a and 48b may be stripped employing methods as are conventional in the semiconductor product fabrication art, including but not limited to wet chemical stripping methods, dry plasma stripping methods and aggregate stripping methods thereof.

Figure 8:
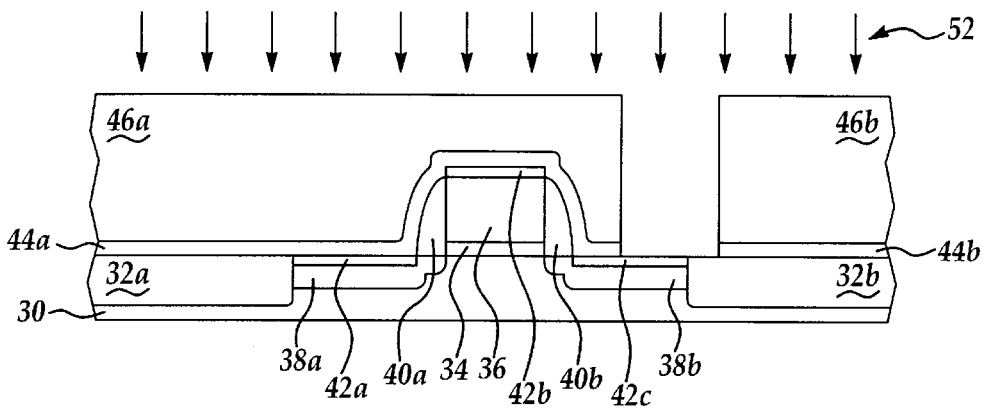

FIG. 8 illustrates the results of further processing of the semiconductor product of FIG. 7.

FIG. 8 illustrates the results of etching the blanket conformal etch stop layer 44 to form a pair of patterned conformal etch stop layers 44a and 44b which in conjunction with the pair of patterned planarized pre-metal dielectric layers 46a and 46b define a borderless via which reaches the metal silicide layer 42c and the isolation region 32b. Within the invention, the borderless via is formed while employing the pair of patterned planarized pre-metal dielectric layers 46a and 46b as an etch mask layer, in conjunction with a second etching plasma 52.

Within the second preferred embodiment of the invention, the second etching plasma 52 employs methods and materials analogous or identical to those employed within the second etching plasma 20 within the first preferred embodiment of the invention. In accord with the first preferred embodiment of the invention, the second etching plasma 52 is selective for the blanket conformal etch stop layer 44 with respect to the metal silicide layer 42c and thus the physical and electrical integrity of the metal silicide layer 42c is maintained.

Figure 9:
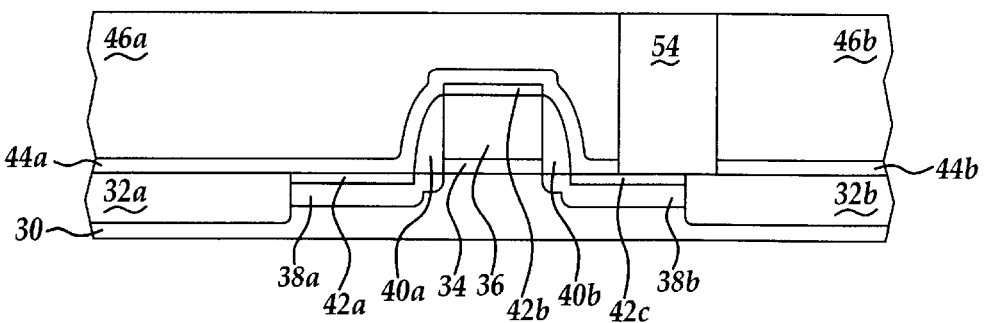

FIG. 9 shows the results of further processing of the semiconductor product of FIG. 8.

FIG. 9 shows the results of forming a conductor stud layer 54 into the borderless via defined by the pair of patterned planarized pre-metal dielectric layers 46a and 46b and the pair of patterned conformal etch stop layers 44a and 44b.

Within the invention, the conductor stud layer 54 may be formed employing methods and materials as are conventional in the microelectronic product fabrication art. Typically, the conductor stud layer 54 is formed of a tungsten material formed upon a barrier material.

FIG. 4 and FIG. 9 illustrate a pair of microelectronic products formed in accord with a pair of preferred embodiments of the invention. The pair of microelectronic products has formed therein a pair of vias accessing a pair of metal silicide layers whose physical and electrical integrity is maintained. Within the invention, the physical and electrical integrity of the pair of metal silicide layers is maintained when forming the pair of vias through a pair of etch stop layers formed thereover by employing a plasma etch method employing an etchant gas composition comprising a fluorine containing gas and a nitrogen containing gas, without an oxygen containing gas or a carbon and oxygen containing gas.

As is understood by a person skilled in the art, the preferred embodiments of the invention are illustrative of the invention rather than limiting of the invention. Revisions and modifications may be made to methods, materials, structures and dimensions in accord with the preferred embodiments of the invention while still providing a method in accord with the invention, further in accord with the accompanying claims.

What is claimed is:

1. A method for fabricating a microelectronic product comprising:

providing a substrate having formed thereover a metal silicide layer;

forming upon the metal silicide layer an etch stop layer;

forming upon the etch stop layer a dielectric layer;

etching, while employing a first plasma etch method, the dielectric layer to form a patterned dielectric layer which exposes the etch stop layer; and etching, while employing a second plasma etch method, the etch stop layer to form a patterned etch stop layer which exposes the metal silicide layer, the second plasma etch method employing an etchant gas composition comprising a fluorine containing gas and a nitrogen containing gas, without an oxygen containing gas or a carbon and oxygen containing gas.

2. The method of claim 1 further comprising:

forming a patterned photoresist layer upon the dielectric layer prior to etching the dielectric layer to form the patterned dielectric layer; and stripping the patterned photoresist layer from the patterned dielectric layer prior to etching the etch stop layer to form the patterned etch stop layer.

3. The method of claim 1 wherein the metal silicide layer is formed from a metal selected from the group consisting of nickel, cobalt, titanium, tantalum, tungsten, vanadium, molybdenum and niobium.

4. The method of claim 1 wherein the metal silicide layer is formed to a thickness of from about 30 to about 600 angstroms.

5. The method of claim 1 wherein the etch stop layer is formed from a silicon containing dielectric material selected from the group consisting of silicon oxide dielectric materials, silicon nitride dielectric materials, silicon oxynitride dielectric materials, silsesquioxane dielectric materials and composites thereof.

6. The method of claim 1 wherein the fluorine containing gas is selected from the group consisting of C1–C6 perfluorocarbons and hydrofluorocarbons, sulfur hexafluoride and nitrogen trifluoride.

7. The method of claim 1 wherein the nitrogen containing gas is selected from the group consisting of nitrogen, ammonia and hydrazine.

8. A method for fabricating a semiconductor product comprising:

providing a semiconductor substrate having formed thereover a metal silicide layer;

forming upon the metal silicide layer an etch stop layer;

forming upon the etch stop layer a dielectric layer;

etching, while employing a first plasma etch method, the dielectric layer to form a patterned dielectric layer which exposes the etch stop layer; and etching, while employing a second plasma etch method, the etch stop layer to form a patterned etch stop layer which exposes the metal silicide layer, the second plasma etch method employing an etchant gas composition comprising a fluorine containing gas and a nitrogen containing gas, without an oxygen containing gas or a carbon and oxygen containing gas.

9. The method of claim 8 further comprising:

forming a patterned photoresist layer upon the dielectric layer prior to etching the dielectric layer to form the patterned dielectric layer; and stripping the patterned photoresist layer from the patterned dielectric layer prior to etching the etch stop layer to form the patterned etch stop layer.

10. The method of claim 8 wherein the metal silicide layer is formed from a metal selected from the group consisting of nickel, cobalt, titanium, tantalum, tungsten, vanadium, molybdenum and niobium.

11. The method of claim 8 wherein the metal silicide layer is formed to a thickness of from about 30 to about 600 angstroms.

12. The method of claim 8 wherein the etch stop layer is formed from a silicon containing dielectric material selected from the group consisting of silicon oxide dielectric materials, silicon nitride dielectric materials, silicon oxynitride dielectric materials, silsesquioxane dielectric materials and composites thereof.

13. The method of claim 8 wherein the fluorine containing gas is selected from the group consisting of C1–C6 perfluorocarbons and hydrofluorocarbons, sulfur hexafluoride and nitrogen trifluoride.

14. The method of claim 8 wherein the nitrogen containing gas is selected from the group consisting of nitrogen, ammonia and hydrazine.

15. A method for fabricating a semiconductor product comprising:

providing a semiconductor substrate having formed thereover a metal silicide layer;

forming upon the metal silicide layer an etch stop layer;

forming upon the etch stop layer a dielectric layer;

etching, while employing a first plasma etch method, the dielectric layer to form a patterned dielectric layer which exposes the etch stop layer; and etching, while employing a second plasma etch method, the etch stop layer to form a patterned etch stop layer which exposes the metal silicide layer, the second plasma etch method employing an etchant gas composition comprising a fluorine containing gas, a nitrogen containing gas and a carrier gas, without an oxygen containing gas or a carbon and oxygen containing gas.

16. The method of claim 15 further comprising:

forming a patterned photoresist layer upon the dielectric layer prior to etching the dielectric layer to form the patterned dielectric layer; and stripping the patterned photoresist layer from the patterned dielectric layer prior to etching the etch stop layer to form the patterned etch stop layer.

17. The method of claim 15 wherein the metal silicide layer is formed from a metal selected from the group consisting of nickel, cobalt, titanium, tantalum, tungsten, vanadium, molybdenum and niobium.

18. The method of claim 15 wherein the metal silicide layer is formed to a thickness of from about 30 to about 600 angstroms.

19. The method of claim 15 wherein:

the fluorine containing gas is selected from the group consisting of C1–C6 perfluorocarbons and hydrofluorocarbons, sulfur hexafluoride and nitrogen trifluoride; and the nitrogen containing gas is selected from the group consisting of nitrogen, ammonia and hydrazine.

20. The method of claim 15 wherein the carrier gas is selected from the group consisting of argon and helium.

* * * * *